US009763347B2

(12) United States Patent
Kawamata

(10) Patent No.: US 9,763,347 B2
(45) Date of Patent: Sep. 12, 2017

(54) SHELL STRUCTURE OF ELECTRICAL DEVICE AND TERMINAL OF LOAD CONTROL SYSTEM HAVING THE SAME

(71) Applicant: Panasonic Intellectual Property Management Co., Ltd., Osaka-shi, Osaka (JP)

(72) Inventor: Mototsugu Kawamata, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/872,095

(22) Filed: Sep. 30, 2015

(65) Prior Publication Data

US 2016/0095239 A1    Mar. 31, 2016

(30) Foreign Application Priority Data

Sep. 30, 2014    (JP) ................. 2014-200964

(51) Int. Cl.
*H05K 5/02*    (2006.01)
*H05K 5/06*    (2006.01)

(52) U.S. Cl.
CPC ............. *H05K 5/0247* (2013.01); *H05K 5/02* (2013.01); *H05K 5/0217* (2013.01); *H05K 5/06* (2013.01)

(58) Field of Classification Search
CPC ...... H05K 5/0247; H05K 5/02; H05K 5/0217; H05K 5/06
USPC .......... 361/679.01, 732, 736, 752, 796, 800, 361/807, 826, 827; 174/60
See application file for complete search history.

(56) References Cited

U.S. PATENT DOCUMENTS

| 5,967,829 | A  | * | 10/1999 | Shinchi | H01R 13/504 29/871 |
| 6,768,054 | B2 | * | 7/2004  | Sato    | H02G 3/088 174/50 |
| 6,927,336 | B2 | * | 8/2005  | Huang   | H04M 19/00 174/50 |
| 7,762,415 | B2 | * | 7/2010  | Matsui  | H02G 3/088 174/58 |

(Continued)

FOREIGN PATENT DOCUMENTS

| JP | S59-84101 U | 6/1984 |
| JP | S60-12029 U | 1/1985 |

(Continued)

*Primary Examiner* — Steven T Sawyer
*Assistant Examiner* — Sagar Shrestha
(74) *Attorney, Agent, or Firm* — McDermott Will & Emery LLP

(57) ABSTRACT

A shell structure of an electrical device includes a first body and a second body. The first body has one or more first lead-out portions, and the second body has one or more second lead-out portions so that electric wires are drawn out. Each of one or more first lead-out portions is formed in the shape of a groove which penetrates a first peripheral wall of the first body and which is opened toward an opening of the first body. Each of the one or more second lead-out portions is formed in the shape of a groove which penetrates a second peripheral wall of the second body and which is opened toward an opening of the second body. The first body and the second body are combined together by allowing the one or more first lead-out portions and the one or more second lead-out portions to overlap with each other.

8 Claims, 12 Drawing Sheets

(56) References Cited

U.S. PATENT DOCUMENTS

| | | | | |
|---|---|---|---|---|
| 7,918,430 | B2* | 4/2011 | Romerein | H04M 1/0293 |
| | | | | 248/223.41 |
| 8,982,541 | B1* | 3/2015 | Roberts | A63H 17/262 |
| | | | | 361/622 |
| 2002/0057360 | A1* | 5/2002 | Abe | H04N 5/2252 |
| | | | | 348/373 |
| 2002/0121433 | A1* | 9/2002 | Vogt | H01H 13/70 |
| | | | | 200/302.1 |
| 2010/0218797 | A1* | 9/2010 | Coyle, Jr. | H02S 40/345 |
| | | | | 136/243 |
| 2011/0090654 | A1* | 4/2011 | Mizukami | H05K 5/0247 |
| | | | | 361/752 |
| 2011/0226526 | A1* | 9/2011 | Chu | H02G 3/088 |
| | | | | 174/659 |
| 2013/0010443 | A1* | 1/2013 | Takamura | H01R 12/721 |
| | | | | 361/752 |
| 2013/0146118 | A1* | 6/2013 | Kelley | H05K 5/02 |
| | | | | 136/244 |

FOREIGN PATENT DOCUMENTS

| | | |
|---|---|---|
| JP | S61-278 U | 1/1986 |
| JP | H1-166695 A | 6/1989 |
| JP | H5-48382 A | 2/1993 |

\* cited by examiner

SHELL STRUCTURE OF ELECTRICAL DEVICE AND TERMINAL OF LOAD CONTROL SYSTEM HAVING THE SAME

CROSS-REFERENCE TO RELATED APPLICATIONS

This application claims priority to Japanese Patent Application No. 2014-200964 filled on Sep. 30, 2014, the entire contents of which are incorporated herein by reference.

TECHNICAL FIELD

The disclosure relates to a shell structure of an electrical device and a terminal of a load control system. More particularly, the disclosure relates to a shell structure for drawing out an electric wire electrically connected to an electrical part accommodated within the shell structure, and a terminal of a load control system, which includes the shell structure.

BACKGROUND ART

Japanese Unexamined Utility Model Application Publication No. 1986-278 discloses an automatic blinking device (electrical device) which has a fixing structure of a lead wire drawn out from a device housing (shell structure) for accommodation of electrical parts. The device housing (shell structure) includes a body with its lower surface opened and a light-transmitting cover configured to close a lower surface opening of the body.

Electrical parts such as a photoelectric conversion element and the like are accommodated within the device housing. A lead wire (electric wire) having one end electrically connected to the electrical parts is drawn out of the device housing through an outlet provided in a fitting portion of the body and the cover.

The outlet includes a body-side groove having a semicircular cross-sectional shape, which is provided on an inner surface of a peripheral wall of the body, and a cover-side groove having a semicircular cross-sectional shape, which is provided on an outer surface of a peripheral wall of the cover fitted to the inner surface of the peripheral wall of the body. The body-side groove is formed to have a depth larger than the depth of the cover-side groove. On the inner surface of the peripheral wall of the body, there are provided triangular ribs extending along the opposite opening edges of the groove and leading to the top plate of the body.

When assembling the device housing, a lead wire is fitted to the groove of the body and then the cover is attached to the body. Accordingly, the lead wire is temporarily fixed to the groove of the body until the cover is attached to the body. This makes it possible to easily attach the cover to the body.

However, in Japanese Unexamined Utility Model Application Publication No. 1986-278 described above, the lead wire is fitted to the groove in a state in which the lead wire is bent substantially at a right angle from the top plate of the body along the peripheral wall. For that reason, the lead wire may be jutted out of the groove by the elastic force of a conductor (core) or an insulator (covering) of the lead wire. This poses a problem in that it is difficult to temporarily fix the lead wire.

SUMMARY OF THE INVENTION

In view of the above, the disclosure provides a shell structure of an electrical device and a terminal of a load control system including the electrical device having the shell structure, which make it easy to temporarily fix an electric wire.

In accordance with an aspect of the disclosure, there is provided a shell structure of an electrical device. The electrical device includes one or more electrical parts accommodated within the shell structure, and one or more electric wires electrically connected at one ends to the electrical parts and drawn out of the shell structure. The shell structure includes a first body and a second body. The first body includes a first bottom wall and a first peripheral wall which surrounds a periphery of the first bottom wall, and has the shape of a box with an opening. The second body includes a second bottom wall and a second peripheral wall which surrounds a periphery of the second bottom wall, and has the shape of a box with an opening. The first circumferential wall includes one or more first lead-out portions provided at the side of the opening of the first body so that the electric wires are drawn out through the one or more first lead-out portions. The second peripheral wall includes one or more second lead-out portions provided at the side of the opening of the second body so that the electric wires are drawn out through the one or more second lead-out portions. Each of the one or more first lead-out portions is formed in the shape of a groove which penetrates the first peripheral wall in a thickness direction thereof and which is opened toward the opening of the first body. Each of the one or more second lead-out portions is formed in the shape of a groove which penetrates the second peripheral wall in a thickness direction thereof and which is opened toward the opening of the second body. The first body and the second body are combined together by allowing the openings of the first body and the second body to face each other and by allowing the one or more first lead-out portions and the one or more second lead-out portions to overlap with each other along the thickness direction of the first peripheral wall and the second peripheral wall.

In accordance with another aspect of the disclosure, there is provided a terminal for use in a load control system. The load control system includes a control terminal configured to control a load, and a transmission device electrically connected to the control terminal via signal lines, wherein the terminal is electrically connected to the transmission device via the signal lines, and configured to transmit a transmission signal to the transmission device via the signal lines. The transmission device is configured to, upon receiving the transmission signal, transmit a transmission signal for the control of the load to the control terminal via the signal lines. The control terminal is configured to receive the transmission signal for the control of the load and to control the load. The terminal for use in the load control system includes: a shell structure including a box-shaped first body having an opening and a box-shaped second body having an opening; and electrical parts accommodated within the shell structure and configured to transmit the transmission signal via the signal lines. The electric wires including the signal lines are electrically connected at one ends to the electrical parts and drawn out of the shell structure. The first body includes a first bottom wall and a first peripheral wall which surrounds a periphery of the first bottom wall. The first peripheral wall includes one or more first lead-out portions provided at the side of the opening of the first body so that the electric wires are drawn out through the one or more first lead-out portions. The second body includes a second bottom wall and a second peripheral wall which surrounds a periphery of the second bottom wall. The second peripheral wall includes one or more second lead-out portions provided at the side of the opening of the second body so that the electric wires are drawn out through the one or more second lead-out portions. Each of the one or more first lead-out portions is formed in the shape of a groove which penetrates the first peripheral wall in a thickness direction thereof and which is opened toward the opening of the first body. Each of the one or more second lead-out portions is formed in the shape of a groove which penetrates the second peripheral wall in a thickness direction thereof and which is opened toward the opening of the second body. The first body and the second body are combined together by allowing the openings of the first body and the second body to face each other and by allowing the one or more first lead-out portions and the one or more second lead-out portions to overlap with each other along the thickness direction of the first peripheral wall and the second peripheral wall.

According to the shell structure of the electrical device and the terminal of the load control system, it is possible to make it easy to temporarily fix an electric wire.

BRIEF DESCRIPTION OF THE DRAWINGS

The figures depict one or more implementations in accordance with the present teaching, by way of example only, not by way of limitations. In the figures, like reference numerals refer to the same or similar elements.

DETAILED DESCRIPTION

A shell structure of an electrical device according to an embodiment of the disclosure and a terminal of a load control system according to an embodiment of the disclosure will now be described in detail with reference to the drawings. An electrical device to which the technical concept of the shell structure can be applied is not limited to a terminal of a load control system (a contact input terminal 4 to be described later) but may be any electrical device in which an electric wire is drawn out of a shell structure.

Figure 1:
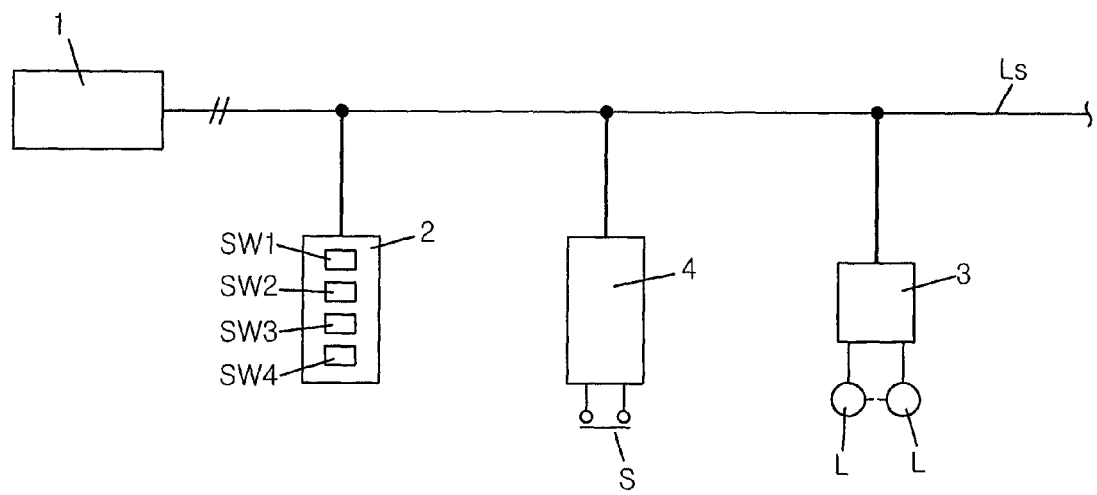
FIG. 1 is a system configuration view of a load control system including a terminal (contact input terminal) of a load control system according to an embodiment of the disclosure.
Figure 2:
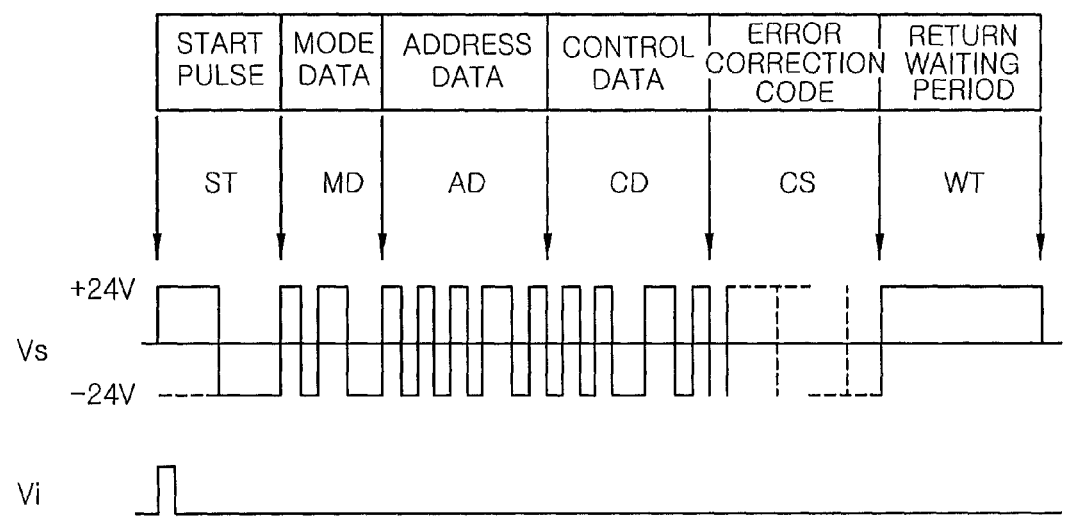
FIG. 2 is an explanatory view of a transmission signal and an interrupt signal used in the load control system.

First, descriptions will be made on a load control system according to the present embodiment. As illustrated in FIG. 1, the load control system includes a transmission device 1, an operation terminal 2, a control terminal 3 and a contact input terminal 4, which are electrically connected to one another via two-wire-type signal lines Ls. Relays are installed within the control terminal 3 and loads (e.g., illumination loads L) are electrically connected to relay contact points of the relays. The transmission device 1 is configured to exchange data with the respective terminals 2 to 4 by sending, through the signal lines Ls, a transmission signal Vs of the type illustrated in FIG. 2.

The transmission signal Vs is composed of a start pulse ST, mode data MD, address data AD, control data CD, an error correction code CS, a return waiting period WT, etc. The start pulse ST indicates the start of sending of the transmission signal Vs. The mode data MD indicate the mode of the transmission signal Vs. The address data AD indicate the identification codes for individually recognizing the respective terminals 2 to 4. The control data CD indicate the control contents for the illumination loads L. The error correction code CS is checksum data for detecting, e.g., a transmission error. The return waiting period WT indicates a period during which a return signal is returned from each of the terminals 2 to 4. The transmission signal Vs is a time-division multiplexed signal having bipolarity (±24 V) and is configured such that data are transmitted by pulse width modulation. When an address contained in the address data AD of the transmission signal Vs received via the two-wire-type signal lines Ls matches with its own address, each of the terminals 2 to 4 accepts the control data CD of the transmission signal Vs. In synchronism with the return waiting period WT of the transmission signal Vs, each of the terminals 2 to 4 which has accepted the control data CD returns a return signal to the transmission device 1 as a current mode signal (a signal sent by short-circuiting the signal lines Ls through a suitable low impedance).

The operation terminal 2 includes a plurality of (four, in the illustrated example) operation switches SW1 to SW4. The operation terminal 2 is configured to, upon operating any one of the operation switches SW1 to SW4, send an interrupt pulse in a current mode during a reception period of the start pulse ST of the transmission signal Vs transmitted in a normal case.

The transmission device 1 includes a signal transmitting unit and an interrupt processing unit. The signal transmitting unit is configured to, by setting the mode data MD in a polling mode, constantly send a transmission signal Vs having address data AD of the terminals 2 to 4 monitored at all times or dummy address data AD. Furthermore, the signal transmitting unit receives an interrupt signal Vi (see FIG. 2) sent from the operation terminal 2 in response to the operation of the operation switches SW1 to SW4 and in synchronism with the start pulse ST of the transmission signal Vs. In the meantime, the interrupt processing unit is configured to sequentially send a transmission signal Vs having group addresses for identifying the operation terminal 2 on a group-by-group basis and to detect the operation terminal 2 which has sent the interrupt signal Vi. The operation terminal 2 which has sent the interrupt signal Vi is configured to, when a group address to which the corresponding operation terminal 2 belongs is accessed, return its own address as a return signal during the return waiting period WT. Based on the address data of the return signal received by the signal transmitting unit, the transmission device 1 detects the operation terminal 2 which has sent the interrupt signal Vi. In addition, the interrupt processing unit of the transmission device 1 sends a transmission signal Vs for gaining access to the corresponding operation terminal 2, and causes the corresponding operation terminal 2 to return a return signal having operation data of the operation switches SW1 to SW4 during the return waiting period WT.

Through the series of interrupt processes described above, the transmission device 1 prepares control data CD to be sent to the control terminal 3 associated in advance with the address of the corresponding operation terminal 2, and transmits the control data CD and the address data AD of the corresponding control terminal 3 in a time-division multiplexed manner using the transmission signal Vs. The control terminal 3 accessed by the transmission signal Vs turns the relays on and off in a corresponding relationship with the control data CD, thereby switching the turn-on and turn-off of the illumination loads L.

As described above, in the load control system according to the present embodiment, by operating the operation switches SW1 to SW4 of the operation terminal 2, it is possible to turn on and off the illumination loads L connected to the corresponding control terminal 3. Since the load control system (also referred to as a remote monitoring control system) is well-known in the art, no illustration and description will be made on the detailed configurations of the transmission device 1, the operation terminal 2 and the control terminal 3.

The contact input terminal 4 has a shell structure of an electrical device according to the present embodiment. The contact input terminal 4 is configured to monitor a state of an external contact point S. When a contact input (an on/off change of the external contact point S) is generated, similar to the operation terminal 2, the contact input terminal 4 generates an interrupt signal Vi at that time point. Furthermore, the contact input terminal 4 is configured to return the contact input as monitoring data to the transmission device 1 via the signal lines Ls. Based on the monitoring data returned from the contact input terminal 4, the transmission device 1 prepares control data CD to be sent to the control terminal 3 and sends a transmission signal Vs including the prepared control data CD to the signal lines Ls. The control terminal 3 is preferably configured to perform, for example, individual or collective on/off control of the illumination loads L, so-called pattern control of the illumination loads L (on/off control of specific grouped illumination loads L), or scene switching control, based on the control data CD of the transmission signal Vs.

Figure 3:
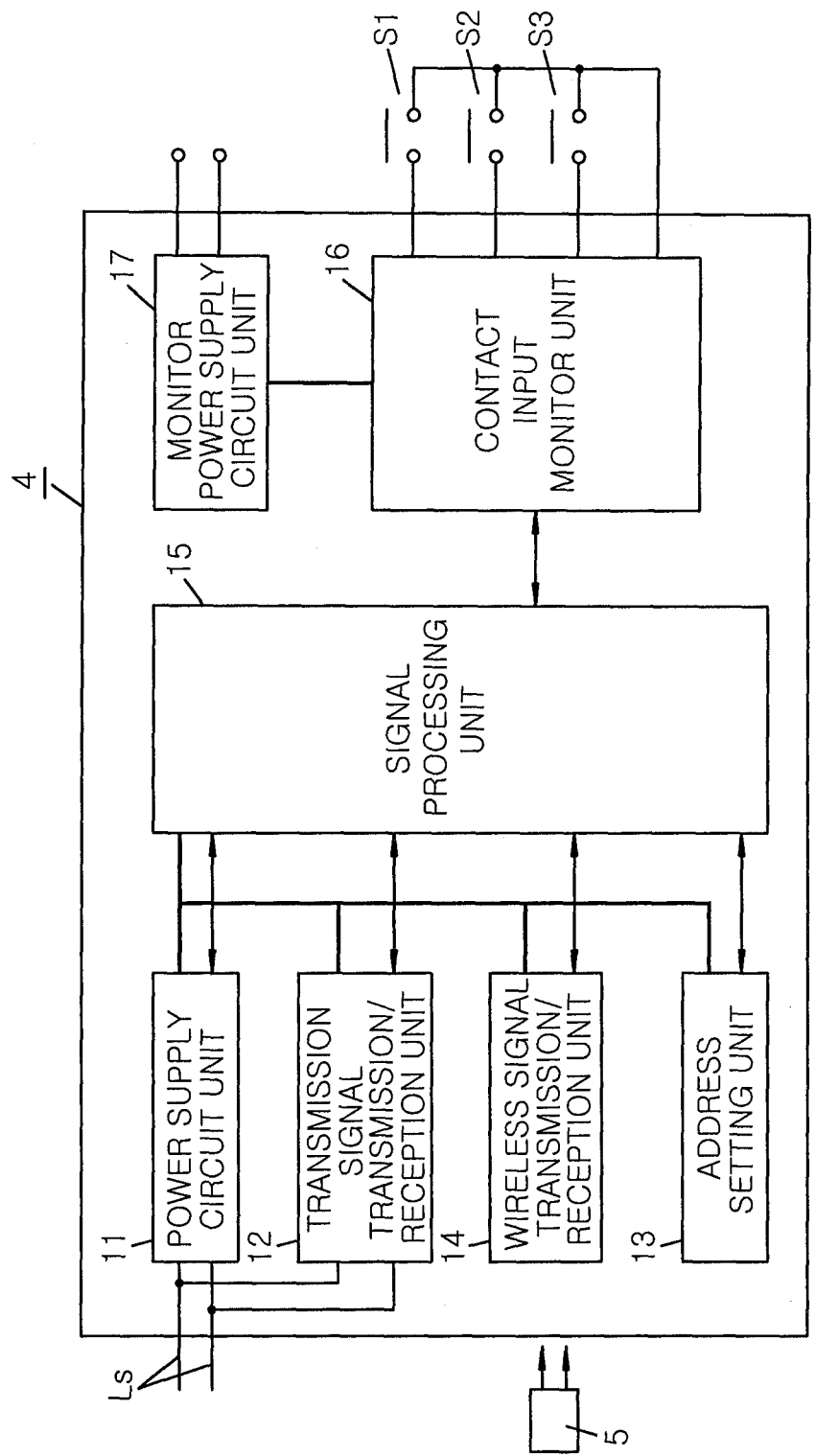
FIG. 3 is a block diagram illustrating a contact input terminal.

Next, the contact input terminal 4 will be described in more detail. As illustrated in FIG. 3, the contact input terminal 4 includes a power supply circuit unit 11, a transmission signal transmission/reception unit 12, an address setting unit 13, a wireless signal transmission/reception unit 14, a signal processing unit 15, a contact input monitor unit 16, a monitor power supply circuit unit 17, etc. The power supply circuit unit 11 is configured to rectify and smoothen a transmission signal Vs, thereby generating operation power of the respective units 12 to 16. Two-wire-type signal lines Ls are electrically connected to the transmission signal transmission/reception unit 12. The transmission signal transmission/reception unit 12 is configured to perform reception of a transmission signal Vs and returning of a return signal through the signal lines Ls. The address setting unit 13 is configured to set an address (an address of the contact input terminal 4) using an optical wireless signal transmitted from an external wireless setter 5. The wireless signal transmission/reception unit 14 is configured to receive an optical wireless signal from the wireless setter 5 and to transmit an optical wireless signal to the wireless setter 5.

The signal processing unit 15 is configured to perform signal processing of the entirety of the contact input terminal 4 using a microcontroller as a major component. The contact input monitor unit 16 is configured to monitor the on/off states of external contact points S1 to S3 and to accept a contact input. The contact input monitor unit 16 is configured to input a monitor signal corresponding to the accepted contact input to an input port of the signal processing unit 15. The monitor power supply circuit unit 17 is configured to receive electric power from an external remote-controlled transformer, thereby obtaining monitor power for the contact input monitor unit 16.

The signal processing unit 15 is preferably configured to, when a monitor signal is inputted from the contact input monitor unit 16, send an interrupt pulse in a current mode during the reception period of the start pulse ST of the normally transmitted transmission signal Vs. Furthermore, the signal processing unit 15 is preferably configured to, if the transmission signal transmission/reception unit 12 receives an access-purpose transmission signal Vs from the transmission device 1, cause the transmission signal transmission/reception unit 12 to return a return signal having monitoring data corresponding to the monitor signal during the return waiting period WT.

Next, the shell structure of the contact input terminal 4 will be described in detail with reference to FIGS. 4 to 11. In the following descriptions, unless specifically mentioned otherwise, the up-down direction, the left-right direction and the front-rear direction will be defined on the basis of FIG. 5.

Figure 4:
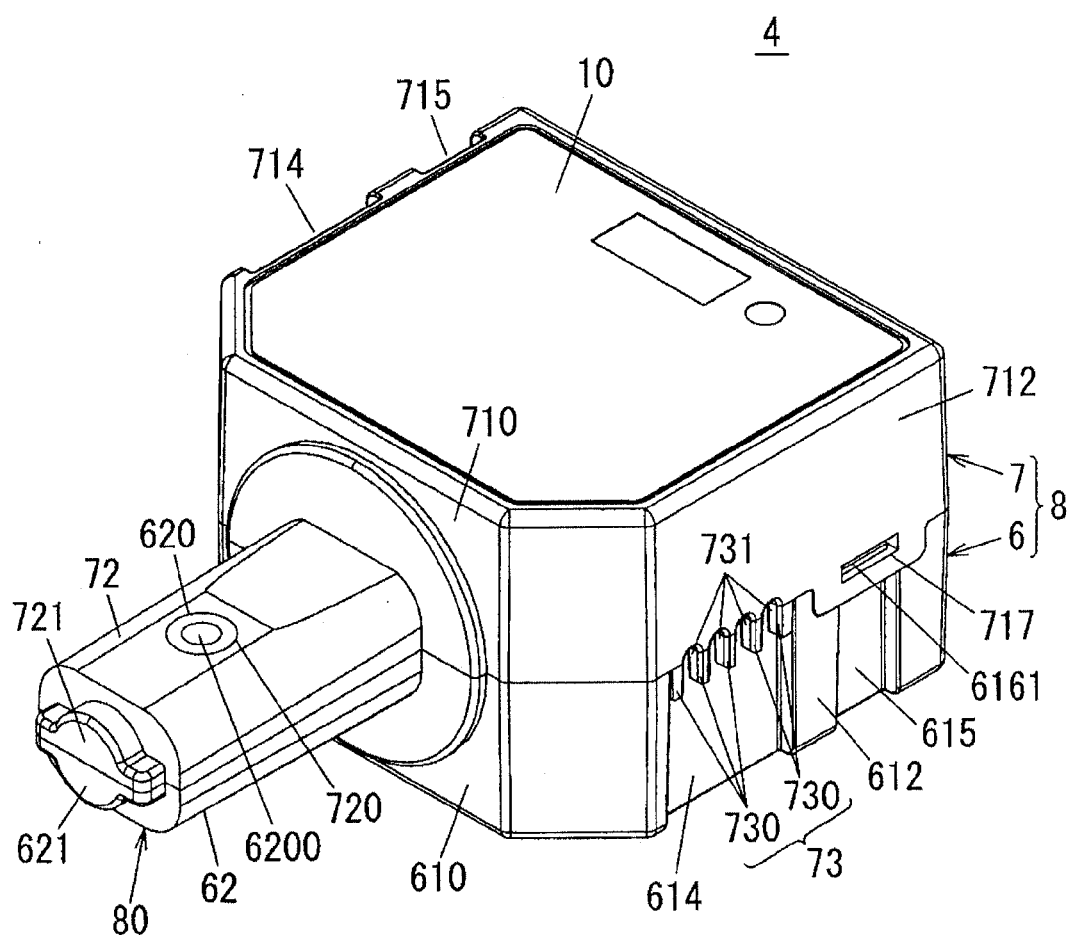
FIG. 4 is a perspective view of the contact input terminal corresponding to an electrical device, which illustrates a shell structure thereof disclosure.
Figure 5:
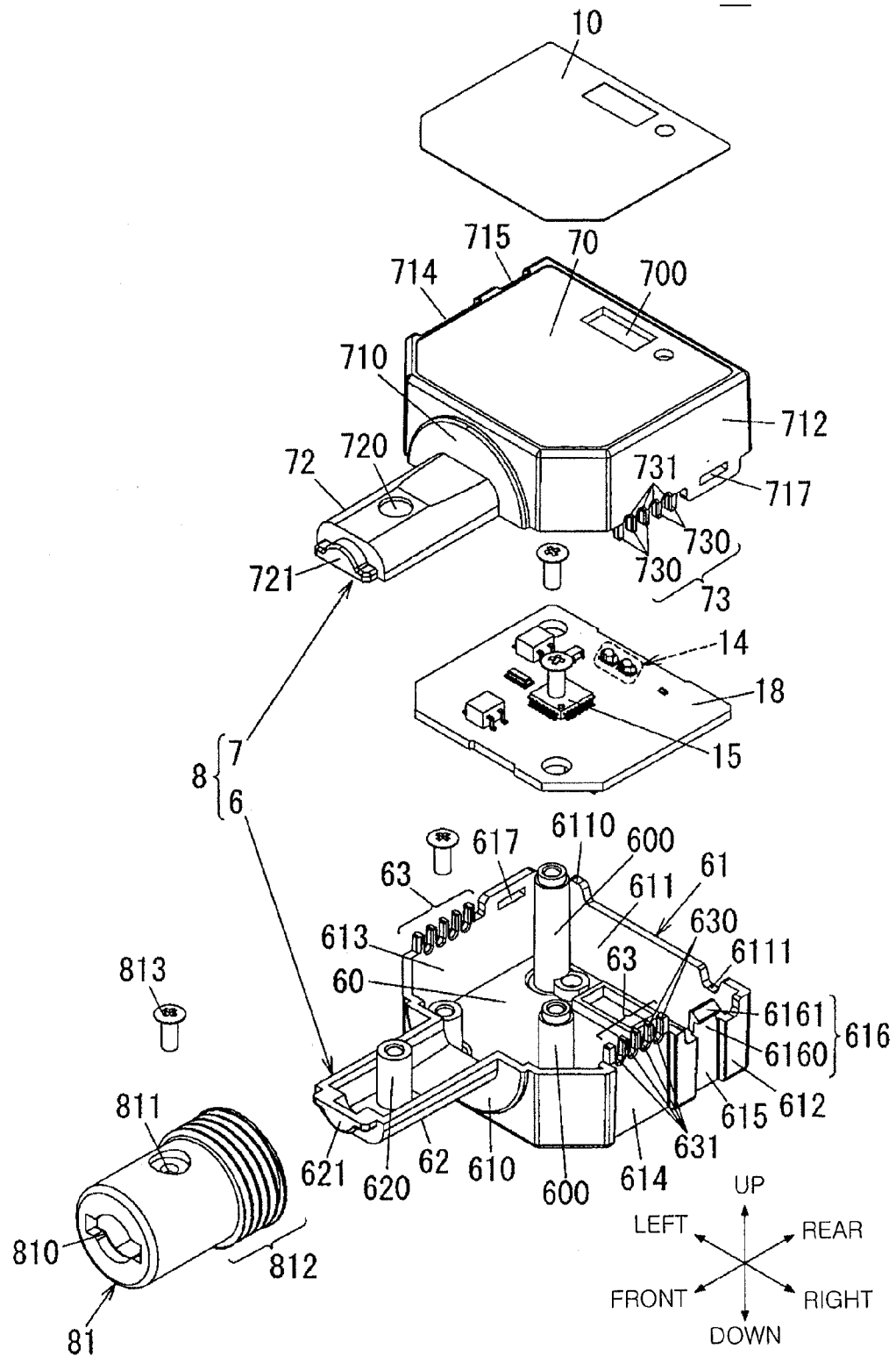
FIG. 5 is an exploded perspective view of the contact input terminal.
Figure 6:
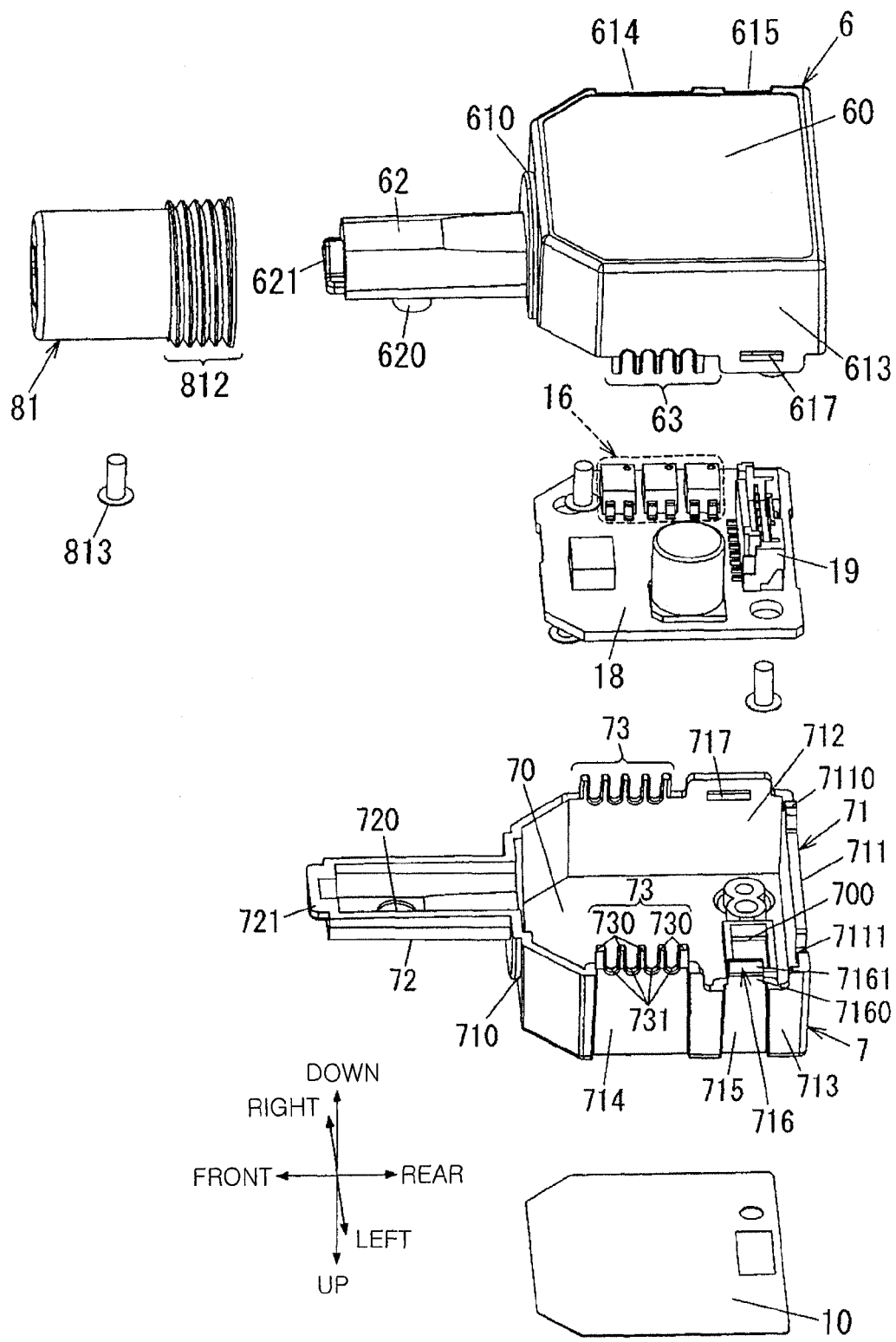
FIG. 6 is an exploded perspective view of the contact input terminal.

As illustrated in FIGS. 4 to 6, a shell structure 8 of the contact input terminal 4 includes a box-shaped first body 6 having an opening, and a box-shaped second body 7 having an opening. The first body 6 and the second body 7 are preferably configured by synthetic resin molded articles. Within the shell structure 8, there is accommodated a printed wiring substrate 18 to which electrical parts constituting the respective units 11 to 17 illustrated in FIG. 3 are mounted (see FIGS. 5 and 6).

The printed wiring substrate 18 has a hexagonal flat plate shape. The wireless signal transmission/reception unit 14, the signal processing unit 15 and the like are mounted on the upper surface of the printed wiring substrate 18 (see FIG. 5). On the other hand, the contact input monitor unit 16, the connector 19 and the like are mounted on the lower surface of the printed wiring substrate 18 (see FIG. 6).

The connector 19 is preferably configured by a receptacle connector electrically connected to wiring conductors of the printed wiring substrate 18. A plug (plug connector) is removably inserted into and connected to the connector 19. It is preferred that two signal lines Ls, two power supply lines extending from a remote-controlled transformer, three input lines extending from three external contact points S1 to S3, and one common line are electrically connected to the plug. That is to say, if the plug is inserted into and connected to the connector 19, eight electric wires in total (two signal lines Ls, two power supply lines, three input lines and one common line) are electrically connected to the wiring conductors of the printed wiring substrate 18. In the following descriptions, the signal lines Ls, the power supply lines, the input lines and the common line will be generically referred to as electric wires 20.

The first body 6 includes a first bottom wall 60 and a first peripheral wall 61 which surrounds the periphery of the first bottom wall 60. The first bottom wall 60 is formed in a hexagonal shape just like the shape of the printed wiring substrate 18. The first peripheral wall 61 has a polygonal tubular shape. The first peripheral wall 61 is preferably one-piece formed with the first bottom wall 60 so as to extend upward from six sides of the first bottom wall 60. Furthermore, a first protrusion wall 62 having a semi-cylindrical shape is preferably one-piece formed with a front portion 610 of the first peripheral wall 61.

A pair of bosses 600 protruding upward is provided on the first bottom wall 60. The printed wiring substrate 18 is preferably screw-fixed to the tip portions of the bosses 600.

In a right portion 612 of the first peripheral wall 61, two recess portions 614 and 615 recessed inward (toward a left portion 613) are formed side by side in a spaced-apart relationship in the front-rear direction. A first comb portion 63 is provided at the upper end of a front recess portion 614 (hereinafter referred to as a front-side recess portion 614). Furthermore, a first hooking portion 616 is provided at the upper end of a rear recess portion 615 (hereinafter referred to as a rear-side recess portion 615).

The first hooking portion 616 includes a rectangular flat projection 6160 and a hooking claw 6161 protruding from the right surface of the upper portion of the projection 6160. The hooking claw 6161 is formed in a triangular columnar shape with the axis thereof extending in the front-rear direction. The projection 6160 is formed so as to be flexed in the thickness direction (the left-right direction).

The first comb portion 63 includes five comb teeth 630 protruding upward from the upper end of the front-side recess portion 614. The five comb teeth 630 are preferably provided at the upper end of the front-side recess portion 614 and arranged side by side in the front-rear direction at a regular interval. First lead-out portions 631 are respectively formed between the comb teeth 630 adjoining each other. Each of the four first lead-out portions 631 is formed in the shape of a groove which penetrates the right portion 612 of the first peripheral wall 61 in the thickness direction and which is opened upward. The lower end portion of each of the first lead-out portions 631 is positioned lower than the upper end of the first peripheral wall 61. The lower end portion of each of the first lead-out portions 631 is preferably formed in a semicircular shape when seen in the thickness direction (the left-right direction) of the right portion 612 of the first peripheral wall 61. Electric wires 20 are respectively inserted into the four first lead-out portions 631. The first lead-out portions 631 are preferably formed at a width dimension (the spacing between the comb teeth 630 in the front-rear direction) substantially equal to the outer diameter of the electric wires 20.

Meanwhile, a first comb portion 63 and a first hooked portion 617 are provided in the left portion 613 of the first peripheral wall 61. The first comb portion 63 of the left portion 613 is formed so as to overlap with the first comb portion 63 of the right portion 612 when seen in the left-right direction. That is to say, the first comb portion 63 includes five comb teeth 630 protruding upward from the frontal upper end of the left portion 613. The five comb teeth 630 are provided at the frontal upper end of the left portion 613 and arranged side by side in the front-rear direction at a regular interval. First lead-out portions 631 are respectively formed between the comb teeth 630 adjoining each other. Each of the four first lead-out portions 631 is formed in the shape of a groove which penetrates the left portion 613 of the first peripheral wall 61 in the thickness direction and which is opened upward. The lower end portion of each of the first lead-out portions 631 is preferably formed in a semicircular shape when seen in the thickness direction (the left-right direction) of the left portion 613 of the first peripheral wall 61.

The first hooked portion 617 is configured by a rectangular through-hole which penetrates the left portion 613 of the first peripheral wall 61 in the thickness direction.

A trapezoidal first projection 6110 and a trapezoidal first recess portion 6111 are preferably provided in a rear portion 611 of the first peripheral wall 61. The first projection 6110 is preferably provided so as to protrude upward from a left upper end portion of the rear portion 611. Furthermore, the first recess portion 6111 is preferably provided at a right upper end portion of the rear portion 611.

A cylindrical boss 620 protruding upward is provided on the inner bottom surface of the first protrusion wall 62. A first rib 621 is provided on the front end surface of the first protrusion wall 62 so as to protrude therefrom.

The second body 7 includes a second bottom wall 70 and a second peripheral wall 71 which surrounds the periphery of the second bottom wall 70. A semi-cylindrical second protrusion wall 72 is preferably one-piece formed with the front portion of the second peripheral wall 71. Except the existence or non-existence of some parts such as the bosses 600 and the like, the second body 7 is formed in a shape and dimension similar to those of the first body 6.

A window hole 700 for enabling the wireless signal transmission/reception unit 14 to transmit and receive a wireless signal is provided in the rear end portion of the second bottom wall 70.

As illustrated in FIG. 6, in a left portion 713 of the second peripheral wall 71, two recess portions 714 and 715 recessed inward (toward a right portion 712) are formed side by side in a spaced-apart relationship in the front-rear direction. A second comb portion 73 is provided at the lower end of a front recess portion 714 (hereinafter referred to as a front-side recess portion 714). Furthermore, a second hooking portion 716 is provided at the lower end of a rear recess portion 715 (hereinafter referred to as a rear-side recess portion 715).

The second hooking portion 716 includes a rectangular flat projection 7160 and a hooking claw 7161 protruding from the left surface of the lower portion of the projection 7160. The hooking claw 7161 is formed in a triangular columnar shape with the axis thereof extending in the front-rear direction. The projection 7160 is formed so as to be flexed in the thickness direction (the left-right direction).

The second comb portion 73 includes five comb teeth 730 protruding downward from the lower end of the front-side recess portion 714. The five comb teeth 730 are preferably provided at the lower end of the front-side recess portion 714 and arranged side by side in the front-rear direction at a regular interval. Second lead-out portions 731 are respectively formed between the comb teeth 730 adjoining each other. Each of the four second lead-out portions 731 is formed in the shape of a groove which penetrates the left portion 713 of the second peripheral wall 71 in the thickness direction and which is opened downward. The upper end portion of each of the second lead-out portions 731 is positioned upper than the lower end of the second peripheral wall 71. The upper end portion of each of the second lead-out portions 731 is preferably formed in a semicircular shape when seen in the thickness direction (the left-right direction) of the second peripheral wall 71. Electric wires 20 are respectively inserted into the four second lead-out portions 731. The second lead-out portions 731 are preferably formed at a width dimension (the spacing between the comb teeth 730 in the front-rear direction) substantially equal to the outer diameter of the electric wires 20.

Meanwhile, a second comb portion 73 and a second hooked portion 717 are provided in the right portion 712 of the second peripheral wall 71. The second comb portion 73 of the right portion 712 is formed so as to overlap with the second comb portion 73 of the left portion 713 when seen in the left-right direction. That is to say, the second comb portion 73 includes five comb teeth 730 protruding downward from the frontal lower end of the right portion 712. The five comb teeth 730 are provided in the right portion 712 and arranged side by side in the front-rear direction at a regular interval. Second lead-out portions 731 are respectively formed between the comb teeth 730 adjoining each other. Each of the four second lead-out portions 731 is formed in the shape of a groove which penetrates the right portion 712 of the second peripheral wall 71 in the thickness direction and which is opened downward. The upper end portion of each of the second lead-out portions 731 is preferably formed in a semicircular shape when seen in the thickness direction (the left-right direction) of the right portion 712 of the second peripheral wall 71.

The second hooked portion 717 is configured by a rectangular through-hole which penetrates the right portion 712 of the second peripheral wall 71 in the thickness direction.

A trapezoidal second projection 7110 and a trapezoidal second recess portion 7111 are preferably provided in the rear portion 711 of the second peripheral wall 71. The second projection 7110 is preferably provided so as to protrude downward from a right lower end portion of the rear portion 711. Furthermore, the second recess portion 7111 is preferably provided at a left lower end portion of the rear portion 711.

A circular insertion hole 720 is formed in the inner bottom surface of the second protrusion wall 72. A second rib 721 is provided on the front end surface of the second protrusion wall 72 so as to protrude therefrom.

The first body 6 and the second body 7 are combined so that the openings thereof face each other, thereby constituting the shell structure 8. That is to say, when the first body 6 and the second body 7 are brought close to each other, the slant surface of the hooking claw 6161 of the first hooking portion 616 makes contact with the lower end of the right portion 712 of the second peripheral wall 71. Thus, the projection 6160 is flexed. Similarly, the slant surface of the hooking claw 7161 of the second hooking portion 716 makes contact with the upper end of the left portion 613 of the first peripheral wall 61. Thus, the projection 7160 is flexed. If the hooking claws 6161 and 7161 reach the second hooked portion 717 and the first hooked portion 617, respectively, the projections 6160 and 7160 are returned from the flexed state to the original state. As a result, the hooking claw 6161 of the first body 6 is hooked to the second hooked portion 717 of the second body 7, and the hooking claw 7161 of the second body 7 is hooked to the first hooked portion 617 of the first body 6, whereby the first body 6 and the second body 7 are combined together (see FIG. 4). The first body 6 and the second body 7 are positioned with each other by the fitting of the first projection 6110 of the first peripheral wall 61 and the second recess portion 7111 of the second peripheral wall 71 and by the fitting of the first recess portion 6111 of the first peripheral wall 61 and the second projection 7110 of the second peripheral wall 71.

Figure 7:
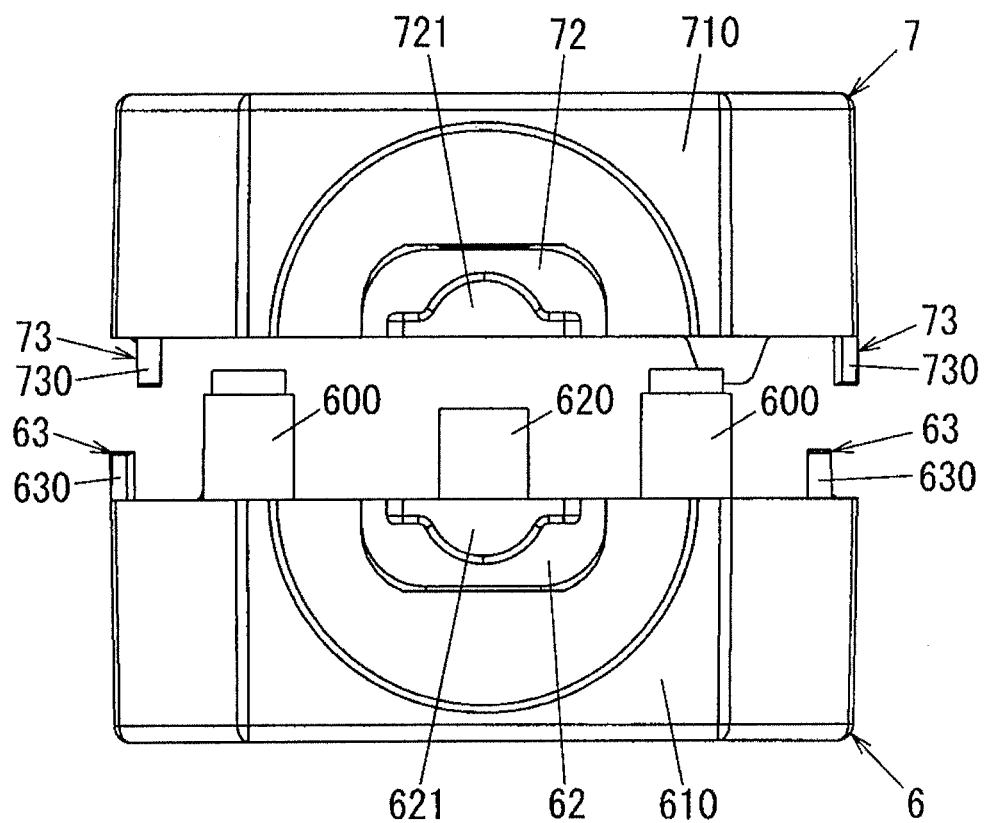
FIG. 7 is a plan view illustrating a first body and a second body of the contact input terminal.
Figure 8:
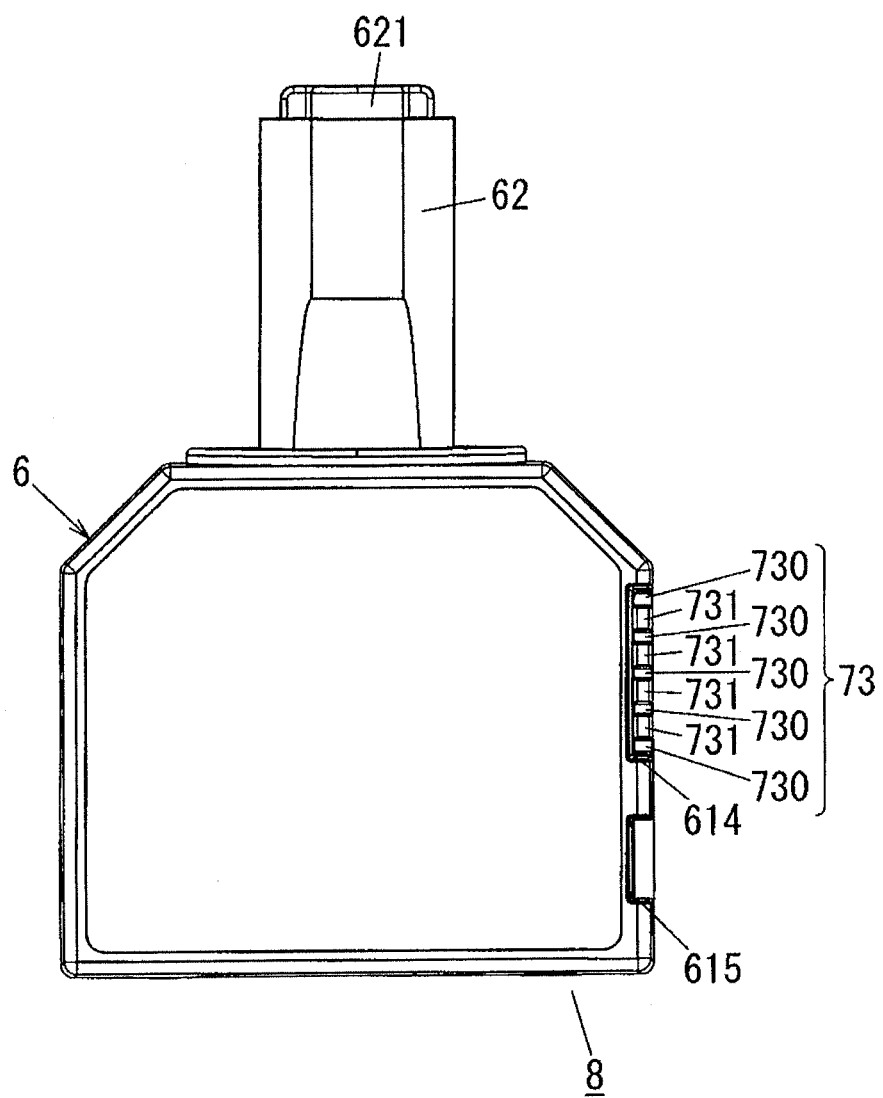
FIG. 8 is a plan view of the contact input terminal.
Figure 9:
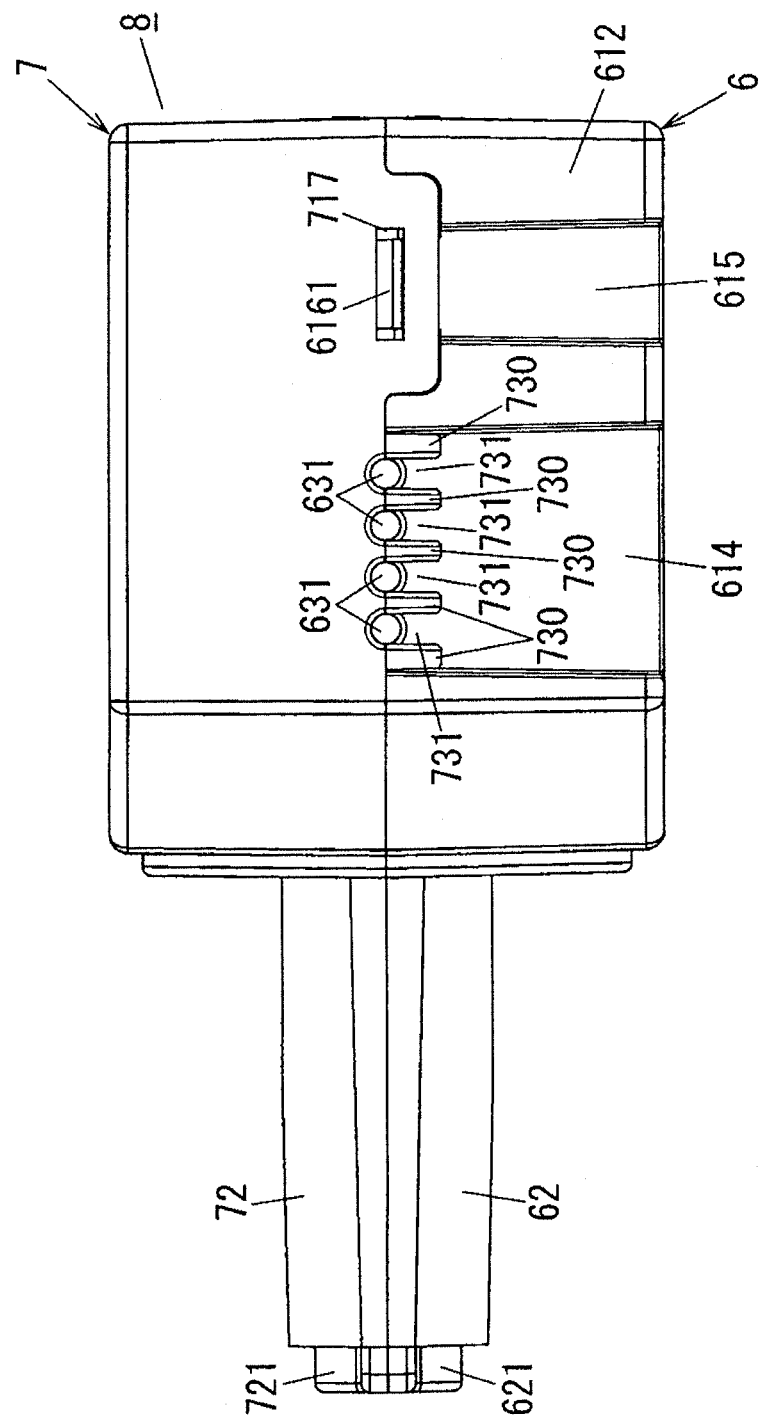
FIG. 9 is a side view of the contact input terminal.

However, as illustrated in FIGS. 7 and 8, the two first comb portions 63 of the first body 6 and the two second comb portions 73 of the second body 7 are position-shifted in the left-right direction. That is to say, the second comb portion 73 existing at the right side of the second body 7 is inserted into the front-side recess portion 614 of the first peripheral wall 61 of the first body 6 (see FIGS. 4 and 8). The first comb portion 63 existing at the left side of the first body 6 is inserted into the front-side recess portion 714 of the second peripheral wall 71 of the second body 7. In this regard, the first lead-out portions 631 are positioned lower than the upper end of the first peripheral wall 61, and the second lead-out portions 731 are positioned upper than the lower end of the second peripheral wall 71. For that reason, the first lead-out portions 631 and the second lead-out portions 731 overlap with each other in the left-right direction. Thus, as illustrated in FIG. 9, four circular lead-out portions are formed on each of the right surface and the left surface of the shell structure 8.

In this regard, the shell structure 8 includes a tubular protrusion portion 80 configured by combining the first protrusion wall 62 and the second protrusion wall 72 (see FIG. 4). The first rib 621 and the second rib 721 protrude from the front end surface of the protrusion portion 80. An attachment member 81 is fixed to the protrusion portion 80 by a screw. The attachment member 81 is preferably made of, e.g., a synthetic resin material, and is formed in a bottomed cylindrical shape with the rearside thereof opened (see FIGS. 5 and 6). A hole 810 into which the first rib 621 and the second rib 721 are fitted is formed on the front surface of the attachment member 81. A circular screw-fixing hole 811 is formed on the peripheral surface of the attachment member 81. A thread portion 812 is one-piece formed with the outer peripheral surface of the rear end portion of the attachment member 81. The attachment member 81 is screw-fixed to the protrusion portion 80 by capping the attachment member 81 on the protrusion portion 80 from the front side, inserting a screw 813 into the screw-fixing hole 811 and the insertion hole 720 of the second protrusion wall 72, and tightening the screw 813 into a thread hole 6200 of the boss 620 of the first protrusion wall 62 (see FIG. 11).

Figure 10:
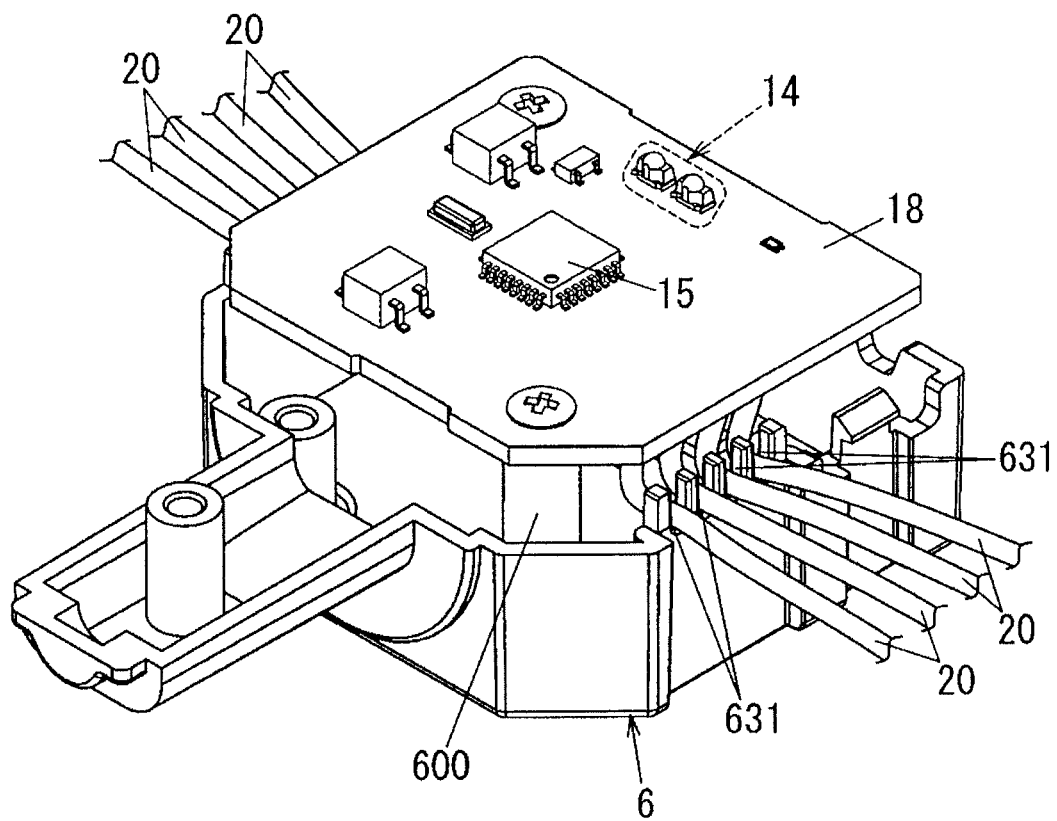
FIG. 10 is an explanatory view for explaining an assembling sequence of the contact input terminal.

Next, an assembling sequence of the contact input terminal 4 will be described with reference to FIG. 10. First, a worker inserts the plug into the connector 19 of the printed wiring substrate 18 and then fits the electric wires 20 to the eight first lead-out portions 631 of the first body 6. At this time, the worker may push the electric wires 20 into the first lead-out portions 631 from the upper side. Then, the worker fixes the printed wiring substrate 18 to the bosses 600 of the first body 6 with screws. At this time, the eight electric wires 20 are respectively held in the first lead-out portions 631. Therefore, the worker can easily fix the printed wiring substrate 18 to the bosses 600 of the first body 6 with screws.

Subsequently, the worker combines the first body 6 and the second body 7 together by capping the second body 7 on the first body 6. As described above, the hooking claw 6161 of the first hooking portion 616 is hooked to the second hooked portion 717. Furthermore, the hooking claw 7161 of the second hooking portion 716 is hooked to the first hooked portion 617. Thus, the first body 6 and the second body 7 are strongly combined together to form the shell structure 8. When the first body 6 and the second body 7 are combined together, the eight electric wires 20 fitted to the first lead-out portions 631 of the first body 6 are individually fitted to the eight second lead-out portions 731 of the second body 7. Accordingly, the eight electric wires 20 are drawn out of the shell structure 8 through the four circular lead-out portions formed on each of the right surface and the left surface of the shell structure 8. Finally, the worker attaches a nameplate 10 to the upper surface of the shell structure 8 (the upper surface of the second bottom wall 70 of the second body 7). The contact input terminal 4 can be assembled in the aforementioned sequence.

In the structure of the shell structure 8 of the present embodiment, unlike the conventional example disclosed in Japanese Unexamined Utility Model Application Publication No. 1986-278, the first lead-out portions 631 and the second lead-out portions 731 are configured by the grooves which penetrate the walls (the first peripheral wall 61 and the second peripheral wall 71). For that reason, no excessive bending stress is applied to the electric wires 20. Therefore, as compared with the conventional example disclosed above, it is possible to easily perform the temporary fixing of the electric wires 20.

As described above, the shell structure of an electrical device according to the present embodiment is the shell structure of the electrical device (the contact input terminal 4) which includes the box-shaped first body 6 having an opening and the box-shaped second body 7 having an opening. The electrical device (the contact input terminal 4) includes one or electrical parts (the printed wiring substrate 18, the connector 19, etc.) accommodated within the shell structure 8 and one or more electric wires 20 electrically connected at one ends to the electrical parts and drawn out of the shell structure 8. The first body 6 includes the first bottom wall 60 and the first peripheral wall 61 which surrounds the periphery of the first bottom wall 60. The second body 7 includes the second bottom wall 70 and the second peripheral wall 71 which surrounds the periphery of the second bottom wall 70. The first peripheral wall 61 includes one or more first lead-out portions 631 through which the electric wires 20 are drawn out. The first lead-out portions 631 are provided in the opening-side portions (at the upper ends of the right portion 612 and the left portion 613). The second peripheral wall 71 includes one or more second lead-out portions 731 through which the electric wires 20 are drawn out. The second lead-out portions 731 are provided in the opening-side portions (at the lower ends of the right portion 712 and the left portion 713). Each of the first lead-out portions 631 is formed in the shape of a groove which penetrates the first peripheral wall 61 in the thickness direction and which is opened toward the opening. Each of the second lead-out portions 731 is formed in the shape of a groove which penetrates the second peripheral wall 71 in the thickness direction and which is opened toward the opening. The first body 6 and the second body 7 are combined together by allowing the openings thereof to face each other and by allowing the first lead-out portions 631 and the second lead-out portions 731 to overlap along the thickness direction of the first peripheral wall 61 and the second peripheral wall 71.

Furthermore, the load control system according to the present embodiment includes the control terminal 3 configured to control loads (illumination loads L), the transmission device 1 electrically connected to the control terminal 3 via the signal lines Ls, and the terminal electrically connected to the transmission device 1 via the signal lines Ls. The load control system is configured such that the transmission signal Vs is transmitted from the terminals (the operation terminal 2 and the contact input terminal 4) via the signal lines Ls. Furthermore, the load control system is configured such that the transmission device 1 which has received the transmission signal Vs transmits a transmission signal Vs for the control of loads (illumination loads L) to the control terminal 3 via the signal lines Ls. Moreover, the load control system is configured such that the control terminal 3 receives the transmission signal Vs transmitted from the transmission device 1 and controls the loads (illumination loads L). The contact input terminal 4, which is a terminal of the load control system, includes the electrical part (the transmission signal transmission/reception unit 12) configured to transmit a transmission signal Vs via the signal lines Ls equivalent to the electric wires 20. The contact input terminal 4 is configured to draw the signal lines Ls through the first lead-out portions 631 and the second lead-out portions 731 to the outside of the shell structure 8.

The shell structure 8 of the electrical device (the contact input terminal 4) according to the present embodiment is configured as described above. Therefore, as compared with the conventional example disclosed above, it is possible to easily perform the temporary fixing of the electric wires 20.

In the electrical device (the contact input terminal 4) according to the present embodiment, if the fixing structure of the printed wiring substrate 18 and the fixing structure of the attachment member 81 are changed and if the bosses 600 and 620 are eliminated from the first body 6, it is possible to form the first body 6 and the second body 7 in an identical shape. If the first body 6 and the second body 7 have an identical shape, it becomes possible to mold the two kinds of bodies 6 and 7 with the same mold. This makes it possible to reduce the manufacturing cost of the shell structure 8.

Figure 11:
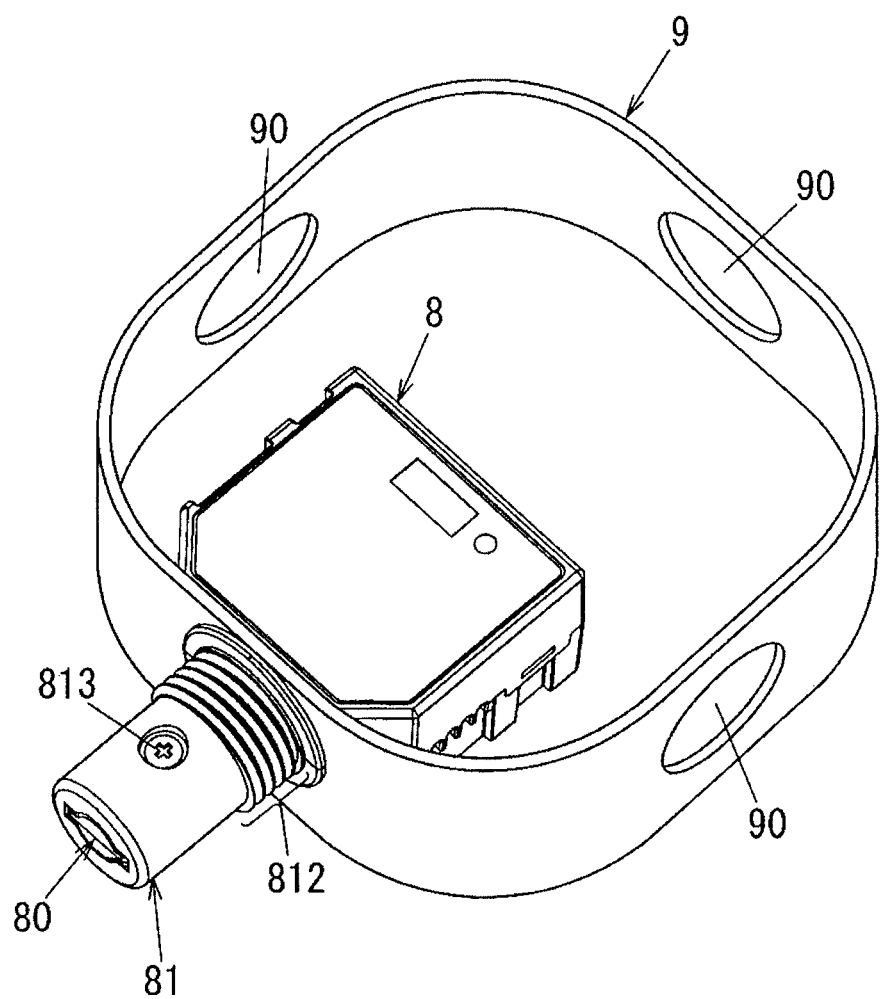
FIG. 11 is a perspective view illustrating an installation state of the contact input terminal.

As illustrated in FIG. 11, the contact input terminal 4 according to the present embodiment is preferably embedded in a wall, a ceiling or a floor of a building using a so-called switch box 9. The switch box 9 is formed by a metal plate or a synthetic resin material in a tubular shape having a flat bottom. On a peripheral wall of the switch box 9, a plurality of (four, in the illustrated example) circular wiring holes 90 is provided at a uniform interval. The switch box 9 is embedded in a wall, a ceiling, a floor or the like and is attached by a suitable method such as screw fixing or the like so that the opening thereof is closed by, e.g., a sensor device or a variety of operation switch devices. Since the switch box 9 is well-known in the art, the illustration and description of the detailed configuration thereof will be omitted.

A worker puts the shell structure 8 into the switch box 9 by inserting the protrusion portion 80, to which the attachment member 81 is attached, into one of the wiring holes 90 and inserting the electric wires 20 into all or some of the remaining three wiring holes 90 (see FIG. 11). Then, the shell structure 8 is attached to the peripheral wall of the switch box 9 by tightening a nut to the thread portion 812 of the attachment member 81 protruding through one of the wiring holes 90. Among the electric wires 20 drawn out from the lead-out portions (the first lead-out portions 631 and the second lead-out portions 731) of the shell structure 8, the signal lines Ls and the power supply lines are drawn out of the switch box 9 through at least one of the remaining three wiring holes 90. The remaining four electric wires 20 (the input lines and the common line) are electrically connected to the sensor device and the like attached to the switch box 9.

In the shell structure 8 according to the present embodiment, at least a portion of the first lead-out portions 631 and the second lead-out portions 731 is preferably formed at a width dimension which is not larger than the outer diameter of the electric wires 20.

Figure 12:
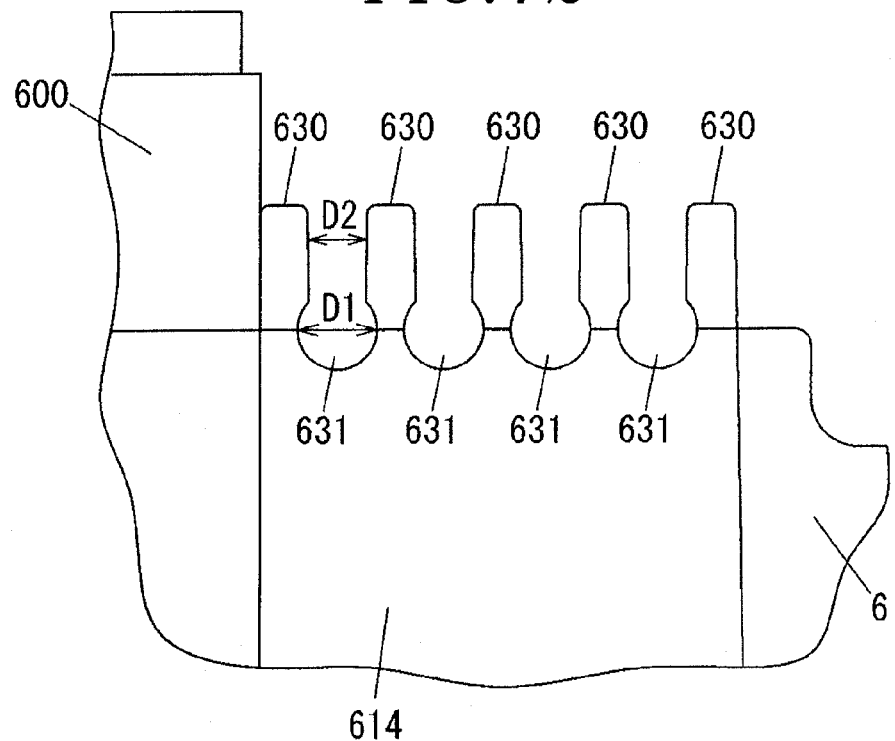
FIG. 12 is a plan view illustrating major portions of the first body of the contact input terminal.

For example, as illustrated in FIG. 12, each of the first lead-out portions 631 is preferably formed to include a lowermost circular section having a width (diameter) D1 substantially equal to the outer diameter of the electric wires 20 and a remaining rectangular section having a width D2 slightly smaller than the outer diameter of the electric wires 20. That is to say, each of the electric wires 20 passes through the rectangular section of each of the first lead-out portions 631 while allowing deformation of a synthetic-resin-made covering thereof. Thereafter, each of the electric wires 20 is inserted into the circular section of each of the first lead-out portions 631. Each of the electric wires 20 inserted into the circular section of each of the first lead-out portions 631 is difficult to pass through the rectangular section having the width D2 smaller than the outer diameter of each of the electric wires 20. Consequently, each of the electric wires 20 is reliably held in each of the first lead-out portions 631.

In the shell structure 8 according to the present embodiment, the shell structure 8 is preferably formed by combining the first body 6 and the second body 7. The first lead-out portions 631 and the second lead-out portions 731 are preferably configured such that, when the shell structure 8 is formed, the sections thereof overlapping along the thickness direction of the first peripheral wall 61 and the second peripheral wall 71 become smaller than the cross section of each of the electric wires 20.

Figure 13:
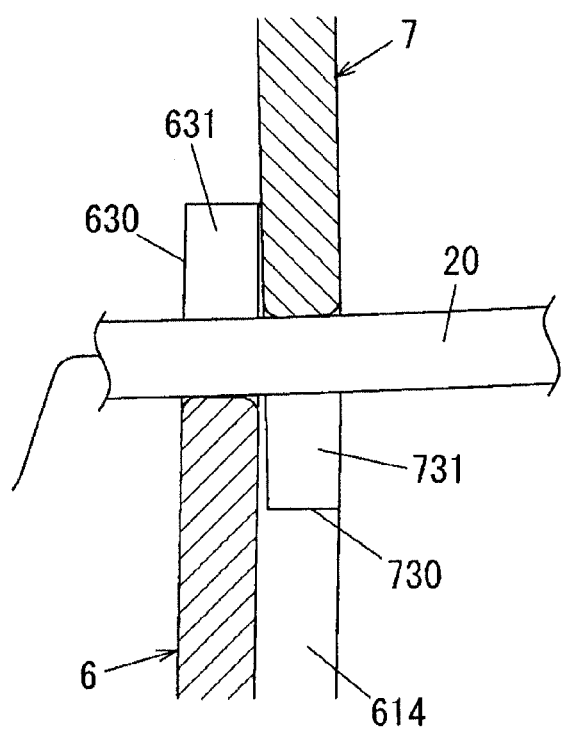
FIG. 13 is a sectional view illustrating major portions of the shell structure of the contact input terminal.

That is to say, as the first lead-out portions 631 and the second lead-out portions 731 overlap with each other in the left-right direction, circular lead-out portions are formed on the right surface and the left surface of the shell structure 8 (see FIG. 9). The first lead-out portions 631 and the second lead-out portions 731 are preferably configured such that the inner diameter of the circular lead-out portions (the sections overlapping along the thickness direction of the first peripheral wall 61 and the second peripheral wall 71) becomes smaller than the outer diameter of the electric wires 20. If the shell structure 8 according to the present embodiment is configured as described above, the inner peripheral surfaces of the first lead-out portions 631 and the second lead-out portions 731 make close contact with the outer peripheral surfaces of the electric wires 20 as illustrated in FIG. 13. Thus, foreign matters such as water droplets and dust are difficult to infiltrate into the shell structure 8 through the lead-out portions.

According to the present embodiment, the shell structure 8 is preferably formed by combining the first body 6 and the second body 7, and the first lead-out portions 631 and the second lead-out portions 731 are preferably configured to, when the shell structure 8 is formed, include sections that do not overlap along the thickness direction of the first peripheral wall 61 and the second peripheral wall 71.

Figure 14:
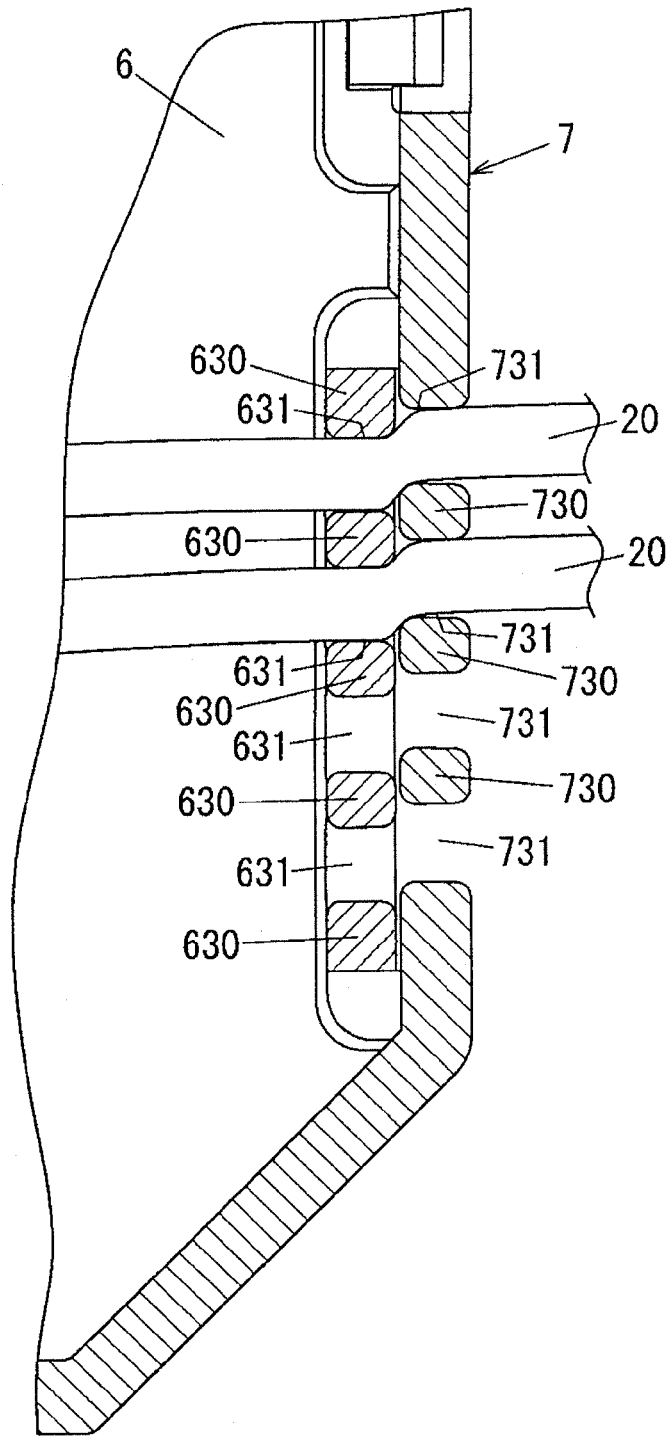
FIG. 14 is a sectional view illustrating major portions of the shell structure of the contact input terminal.

That is to say, as illustrated in FIG. 14, the first lead-out portions 631 and the second lead-out portions 731 are preferably shifted in the front-rear direction (the up-down direction in FIG. 14). If the shell structure 8 according to the present embodiment is configured as described above, the electric wires 20 drawn out through the first lead-out portions 631 and the second lead-out portions 731 are slightly bent and tension-fixed. As a result, even when the electric wires 20 are pulled at the outside of the shell structure 8, an unnecessary force is hardly applied to the connector 19 or the like mounted to the printed wiring substrate 18.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A shell structure of an electrical device which includes one or more electrical parts accommodated within the shell structure, and one or more electric wires electrically connected at one ends to the electrical parts and drawn out of the shell structure, the shell structure comprising:

a first body including a first bottom wall and a first peripheral wall which surrounds a periphery of the first bottom wall, the first body having the shape of a box with an opening; and a second body including a second bottom wall and a second peripheral wall which surrounds a periphery of the second bottom wall, the second body having the shape of a box with an opening, wherein the first peripheral wall includes one or more first lead-out portions provided at the side of the opening of the first body so that the one or more electric wires are drawn out through the one or more first lead-out portions, wherein the second peripheral wall includes one or more second lead-out portions provided at the side of the opening of the second body so that the electric wires are drawn out through the one or more second lead-out portions, wherein each of the one or more first lead-out portions is formed in the shape of a groove which penetrates the first peripheral wall in a thickness direction thereof and which is opened toward the opening of the first body, wherein each of the one or more second lead-out portions is formed in the shape of a groove which penetrates the second peripheral wall in a thickness direction thereof and which is opened toward the opening of the second body, wherein the first body and the second body are combined together by allowing the openings of the first body and the second body to face each other and by allowing the one or more first lead-out portions and the one or more second lead-out portions to overlap with each other along the thickness direction of the first peripheral wall and the second peripheral wall, and wherein each of the one or more first lead-out portions and the one or more second lead-out portions has a depth which is larger than an outer diameter of each of the one or more the electric wires, the depth extending along a direction normal to the thickness direction of the first peripheral wall and the second peripheral wall.

2. The shell structure of claim 1, wherein at least a portion of the one or more first lead-out portions and the one or more second lead-out portions is formed to have a width dimension which is not larger than an outer diameter of the electric wires.

3. The shell structure of claim 1, wherein the one or more first lead-out portions and the one or more second lead-out portions are configured such that, when the shell structure is formed by combining the first body and the second body, each section of the one or more first lead-out portions and the one or more second lead-out portions overlapping along the thickness direction of the first peripheral wall and the second peripheral wall becomes smaller than a cross section of each of the electric wires.

4. The shell structure of claim 1, wherein the one or more first lead-out portions and the one or more second lead-out portions are configured to, when the shell structure is formed by combining the first body and the second body, include sections that do not overlap along the thickness direction of the first peripheral wall and the second peripheral wall.

5. The shell structure of claim 1, wherein when the shell structure is formed by combining the first body and the second body, circular lead-out portions are formed by overlapping the one or more first lead-out portions and the one or more second lead-out portions with each other in the thickness direction.

6. The shell structure of claim 5, wherein a recess portion recessed in the thickness direction of the first peripheral wall is formed at the first peripheral wall, and the one or more second lead-out portions are inserted into the recess portion of the first peripheral wall, and
   a recess portion recessed in the thickness direction of the second peripheral wall is formed at the second peripheral wall, and the one or more first lead-out portions are inserted into the recess portion of the second peripheral wall.

7. The shell structure of claim 1, wherein the one or more electric wires are drawn out along the thickness direction of the first peripheral wall and the second peripheral wall through the one or more first lead-out portions and the one or more second lead-out portions.

8. A terminal for use in a load control system including a control terminal configured to control a load, and a transmission device electrically connected to the control terminal via signal lines, wherein the terminal is electrically connected to the transmission device via the signal lines, and configured to transmit a transmission signal to the transmission device via the signal lines, the transmission device is configured to, upon receiving the transmission signal, transmit a transmission signal for the control of the load to the control terminal via the signal lines, and the control terminal is configured to receive the transmission signal for the control of the load and to control the load, the terminal for use in the load control system comprising:
   a shell structure including a box-shaped first body having an opening and a box-shaped second body having an opening; and
   electrical parts accommodated within the shell structure and configured to transmit the transmission signal via the signal lines,
   wherein electric wires including the signal lines are electrically connected at one ends to the electrical parts and drawn out of the shell structure,
   wherein the first body includes a first bottom wall and a first peripheral wall which surrounds a periphery of the first bottom wall, the first peripheral wall including one or more first lead-out portions provided at the side of the opening of the first body so that the electric wires are drawn out through the one or more first lead-out portions,
   wherein the second body includes a second bottom wall and a second peripheral wall which surrounds a periphery of the second bottom wall, the second peripheral wall including one or more second lead-out portions provided at the side of the opening of the second body so that the electric wires are drawn out through the one or more second lead-out portions,
   wherein each of the one or more first lead-out portions is formed in the shape of a groove which penetrates the first peripheral wall in a thickness direction thereof and which is opened toward the opening of the first body,
   wherein each of the one or more second lead-out portions is formed in the shape of a groove which penetrates the second peripheral wall in a thickness direction thereof and which is opened toward the opening of the second body,
   wherein the first body and the second body are combined together by allowing the openings of the first body and the second body to face each other and by allowing the one or more first lead-out portions and the one or more second lead-out portions to overlap with each other along the thickness direction of the first peripheral wall and the second peripheral wall, and
   wherein each of the one or more first lead-out portions and the one or more second lead-out portions has a depth which is larger than an outer diameter of each of the one or more the electric wires, the depth extending along a direction normal to the thickness direction of the first peripheral wall and the second peripheral wall.

* * * * *